United States Patent [19]

Asao et al.

[11] 3,984,263

[45] Oct. 5, 1976

[54] METHOD OF PRODUCING DEFECTLESS EPITAXIAL LAYER OF GALLIUM

[75] Inventors: Ichiro Asao; Yoshimasa Ohki; Isamu Akasaki; Masafumi Hashimoto, all of Kawasaki, Japan

[73] Assignee: Matsushita Electric Industrial Co., Ltd., Japan

[22] Filed: Oct. 15, 1974

[21] Appl. No.: 514,917

[30] Foreign Application Priority Data
Oct. 19, 1973 Japan............................. 48-118242

[52] U.S. Cl.................................. 148/175; 148/1.5; 156/610; 156/613; 156/614; 357/17; 357/30
[51] Int. Cl.$^2$............. H01L 21/324; H01L 21/205; H01L 33/00
[58] Field of Search.................. 148/175, 171–173, 148/1.5; 357/30, 17; 156/610, 613, 614

[56] References Cited
UNITED STATES PATENTS

| | | | |
|---|---|---|---|
| 3,100,166 | 8/1963 | Marinace et al................ | 148/175 X |
| 3,508,126 | 4/1970 | Newman et al................. | 148/175 X |
| 3,540,941 | 11/1970 | Lorenz et al.................... | 148/171 X |
| 3,687,744 | 8/1972 | Ogirima et al................... | 148/175 |
| 3,703,671 | 11/1972 | Saul ................................. | 357/30 |
| 3,725,749 | 4/1973 | Groves et al..................... | 357/30 |
| 3,729,348 | 4/1973 | Saul ................................. | 148/172 |

OTHER PUBLICATIONS

Logan et al., "Efficient Green . . . GaP p.n Junctions" Applied Physics Letters, vol. 13, No. 4, 15 Aug. 1968, pp. 139–141.
Logan et al., "p.n Junctions in GaP . . . at 25°C".
Ibid., vol. 10, No. 7, 1 Apr. 1967, pp. 206–208.
Saul et al., "Gap Red Electroluminescent . . . of 7%".
Ibid., vol. 15 No. 7, 1 Oct. 1969, pp. 229–231.
Saul, R. H., Defect Structure of GaP . . . Epitaxial Deposition" J. Electrochem. Soc., Solid State Science., vol. 115, No. 11, Nov. 1968, pp. 1184–1190.
Shih et al., "Preparation of . . . Epitaxial Layers of Gap" J. Applied Physics, vol. 39, No. 6, May 1968, pp. 2747–2749.
Gershenzon et al., "Structural Defects in GaP . . . Effects".
Ibid., vol. 35, No. 7, Jly 1964, pp. 2132–2141.
Toyama et al., "Effect of Heat Treatment . . . Diodes" Trans. Metall. Soc. of Aime, vol. 245, Mar. 1969, pp. 551–557.
Chicotka et al., "Improving the Metallurgical Quality of Semiconductors" IBM Tech. Discl. Bull., vol. 13, No. 12, May 1971, pp. 3788–3789.

Primary Examiner—L. Dewayne Rutledge
Assistant Examiner—W. G. Saba
Attorney, Agent, or Firm—Robert E. Burns; Emmanuel J. Lobato; Bruce L. Adams

[57] ABSTRACT

A nitrogen-doped n-type epitaxial layer of GaP grown from a vapor phase is heated at a temperature ranging from 740° to 1000°C for a selected period of time depending on the temperature. The heat treatment is carried out in $H_2$, $N_2$ or Ar in the presence of Ga and P vapors. Alternatively, a protection coating of $SiO_2$, $Si_3N_4$ or $Al_2O_3$ is formed on the epitaxial layer prior to the heat treatment.

8 Claims, 6 Drawing Figures

3,984,263

METHOD OF PRODUCING DEFECTLESS EPITAXIAL LAYER OF GALLIUM

BACKGROUND OF THE INVENTION

This invention relates generally to the fabrication of a nitrogen-doped gallium phosphide layer by vapor phase epitaxial growth, and more particularly to a method of producing such a layer which is substantially devoid of crystal defects and hence serves for giving a p–n junction of improved characteristics.

It is a well known and significant problem in the art of semiconductors that an epitaxial layer grown from a vapor phase involves frequently certain defects in its crystal. The defects are responsible for unsatisfactory characteristics of the junctions or semiconductor devices based on the epitaxial layer. Accordingly, various techniques have been proposed to form defectless epitaxial layers, but the results have been dissimilar depending on the semiconductor material.

Gallium phosphide is one of the materials for which the problem of such crystal defects is still unsolved. When a green-light-emitting GaP diode is produced by initially forming a nitrogen-doped n-type GaP epitaxial layer from a vapor phase and thereafter fabricating a p–n junction by diffusing zinc into the surface region of the n-type layer, the luminous efficiency of the diode is not so high as one of the similar diode produced by a solution growth method. The inferiority of the vapor growth product is considered to be attributable to crystal defects formed during doping and resulting strains in the epitaxial layer. Such defects and strains may also be created by the influence of the substrate.

SUMMARY OF THE INVENTION

It is therefore an object of the present invention to provide a method of healing the crystal defects and strains in an epitaxial layer of nitrogen-doped GaP grown from a vapor phase.

It is another object of the invention to provide a method of producing an epitaxial layer of nitrogen-doped GaP, which gives a green-light-emitting diode of improved luminous efficiency.

According to a method of the invention, an epitaxial layer of GaP deposited on a GaP substrate and having a surface region doped with nitrogen is subjected to a heat treatment. The temperature and time of the heat treatment lie within the polygonal area A-B-C-D-E-F shown in FIG. 5 of the drawing, which area is bounded by the lines connecting the coordinates:

|   | temperature, °C | time, hr |
|---|---|---|
| A | 740 | 0.25 |
| B | 740 | 7.0 |
| C | 850 | 6.0 |
| D | 900 | 2.5 |
| E | 950 | 0.75 |
| F | 1000 | 0.5 | and the epitaxial layer is protected against evaporation of any component thereof and chemical action of any foreign substance thereon during the heat treatment. To accomplish the protection, the heat treatment is preferably carried out in a stream of hydrogen, nitrogen or argon and in the presence of a gallium melt saturated with GaP. Alternatively, the epitaxial layer is coated with a film of silicon dioxide, silicon nitride or aluminum oxide.

A green-light-emitting diode produced by forming a zinc-diffused region on the thus treated layer exhibits a luminous efficiency up to nearly four times as high as that attained without the heat treatment.

BRIEF DESCRIPTION OF THE DRAWINGS

The invention will be fully understood from the following detailed description with reference to the accompanying drawings, in which.

DESCRIPTION OF THE PREFERRED EMBODIMENTS

Figure 1:
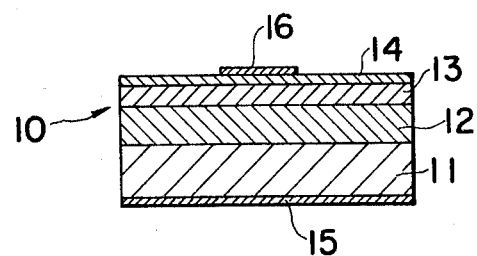
FIG. 1 is a schematic sectional view of a green-light-emitting GaP diode.

A green-light-emitting GaP diode 10 is generally of a construction as illustrated in FIG. 1. A surface of an n-type GaP substrate 11 is coated with an n-type GaP layer 12 formed about 80 to 100 microns thick by vapor epitaxial growth. On this n-type layer 12 an epitaxial layer 13 of GaP doped with an n-type impurity and nitrogen is formed about 20 to 50 microns thick. About 5 to 10 microns thick surface region 14 of the nitrogen-doped layer 13 is a p-type layer resulting from zinc diffusion. The substrate 11 and the p-type layer 14 are provided with first and second electrodes 15 and 16, respectively.

The green-light emission of the diode 10 is attributable to the nitrogen atoms doped into the epitaxial layer 13. Since both nitrogen and phosphorus are elements of Group V, the doped nitrogen atoms usually substitute a part of phosphorus atoms of the GaP crystal. However, a part of the nitrogen atoms are doped into certain spaces between the gallium and phosphorus atoms of the crystal because the nitrogen doping for this purpose aims at attaining such high nitrogen atom concentrations as ranging from $1 \times 10^{18}$ to $1 \times 10^{20}$ per $cm^3$. The intrusion of the doped nitrogen atoms into abnormal positions in the crystal lattices creates the crystal defects and causes strains of the crystal. It is known that the defects and strains of the crystal attributed to such and other causes can be reduced to certain extents by the control of the crystal-growing conditions, but in practice it is extremely difficult to realize such a control as to produce satisfactory results.

Figure 2:
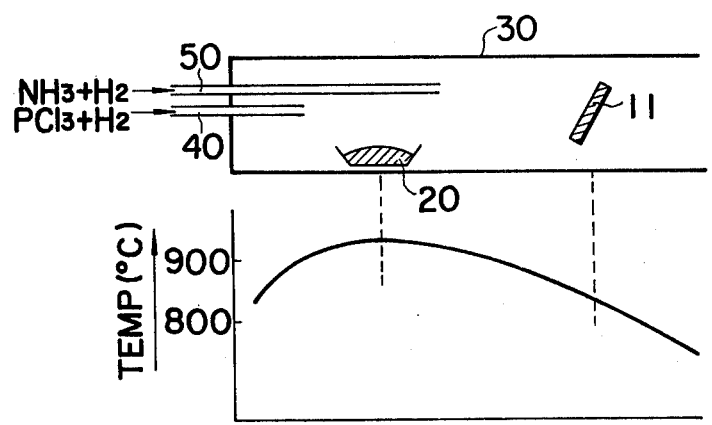
FIG. 2 is a diagrammatic sectional view of apparatus for growing an epitaxial layer of GaP from a vapor phase.

In accordance with the present invention, the nitrogen-doped layer 13 may be formed by a usual method with, e.g., apparatus as illustrated in FIG. 2. The substrate 11 of GaP crystal, which is n-type in this case, and a source material 20 for vapor phase crystal-growth are placed in a reaction tube 30 of, e.g., quartz.

The reaction tube 30 is heated in a furnace (not shown) to create a temperature gradient in the tube 30 as shown in FIG. 2 so as to maintain the source material 20 at about 930°C and the substrate 11 at about 830°C. The source material 20 is usually a melt of gallium, but either a single crystal or polycrystal of GaP may alternatively be used. For growing the n-type epitaxial layers 12 and 13, a gallium melt saturated with GaP and admixed with sulfur as an n-type dopant is usually used as the source material 20. The reaction tube 30 is provided with first and second gas inlets 40 and 50 at one end thereof, so that the source material 20 is located upstream of the substrate 11.

At first, phosphorus trichloride gas carried by hydrogen gas is passed into the reaction tube 30 through the first gas inlet 40. The two gases react with each other to give phosphorus ($P_4$) and hydrogen chloride $$4PCl_3 + 6H_2 \rightarrow P_4 + 12HCl$$

The thus formed hydrogen chloride reacts with gallium of the source material 20 to give gallium monochloride, which in turn reacts with the afore-mentioned phosphorus to form gallium phosphide.

$$2Ga + 2HCl \rightarrow 2GaCl + H_2$$

$$6GaCl + P_4 \rightarrow 4GaP + 2GaCl_3$$

Thus the epitaxial layer 12 of n-type GaP grows on the substrate 11. Then ammonia gas carried by hydrogen gas is passed into the tube 30 through the second gas inlet 50 to grow the nitrogen-doped n-type epitaxial layer 13.

Alternatively, a similar GaP epitaxial layer may be formed by the use of gallium as a source material and hydrogen chloride gas and phosphine gas ($PH_3$) as reaction gases. A method of the invention is applicable to practically any GaP epitaxial layer grown from a vapor phase and doped with nitrogen regardless of the growing process.

We have discovered that the crystal defects and strains in the GaP epitaxial layers 12 and 13 can be healed or eliminated by heating the substrate 11 coated with these layers 12 and 13 at a temperature between 740° and 1000°C for a certain period of time after the process of doping with nitrogen. The heating time must be varied depending on the heating temperature as will be described hereinafter, and the nitrogen-doped epitaxial layer 13 must be protected against evaporation of its components and chemical action of any foreign substance on it during heating. As a first preferred embodiment of such a protection, the heating is carried out in a stream of hydrogen, nitrogen or argon, which is inactive with the GaP layer 13, and in the presence of a gallium melt saturated with GaP. In a second embodiment of the invention, the protection is accomplished by coating the nitrogen-doped epitaxial layer 13 with a thin film of a known protection material such as silicon dioxide, silicon nitride or aluminum oxide.

The heat treatment of the invention may be carried out in the reaction tube 30 of FIG. 2 with the cessation of the feed of phosphorus trichloride and ammonia gases, but with continuance of passing hydrogen gas, and regulation of the heating temperature. Alternatively, the substrate 11 may be once cooled to room temperature and taken out of the apparatus after the completion of the nitrogen-doping and then subjected to the heat treatment in a separate apparatus.

We have ascertained the effects of the heat treatment on the epitaxial layers 12 and 13 by measurement of the luminous efficiency of the green-light-emitting diodes 10 produced from the heat-treated samples. The measurement was carried out over wide ranges of heating temperature and heating time and the results are presented in FIGS. 3 and 4.

Figure 3:
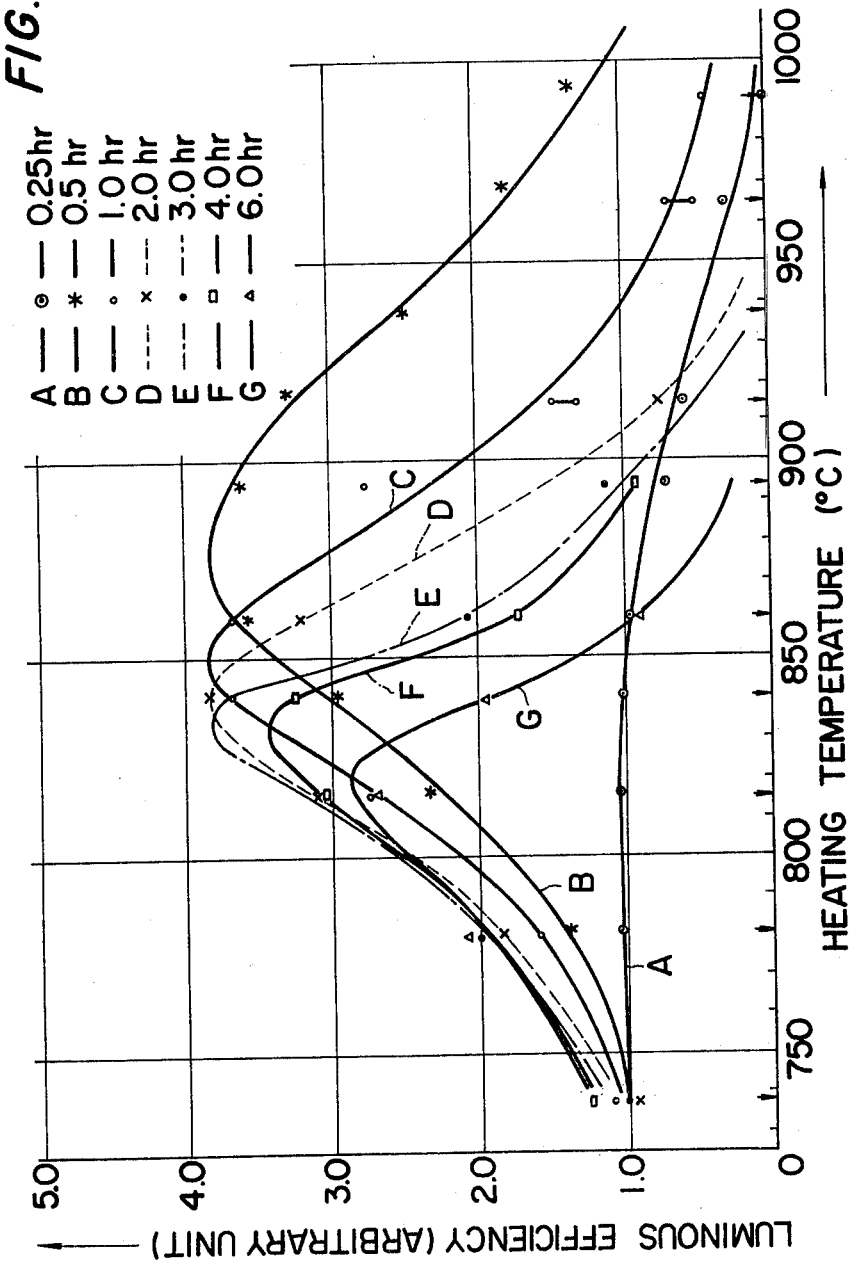
FIG. 3 is a graph showing the relationship between the heating temperature in a method of the invention and the luminous efficiency of green-light-emitting GaP diodes produced from the epitaxial layers which were subjected to the heat treatment in accordance with the invention.

The graph of FIG. 3 shows the relationship between the heating temperature and the luminous efficiency for several heating time values. The luminous efficiency values in both the graphs of FIGS. 1 and 2 are relative values to the luminous efficiency value of a conventional green-light-emitting GaP diode (which value is taken as 1.0) produced by the same process as the experimental samples except that the heat treatment after the nitrogen-doping was omitted. The graph of FIG. 3 teaches that the heat treatment according to the invention affects the luminous efficiency of the light-emitting diode 10 in the following manner.

a. The effective temperature range is between about 740°C and about 1000°C.
b. Highest luminous efficiency values can be obtained at temperatures ranging from about 800°C to about 900°C, and the highest values are nearly four times as high as one attained without the heat treatment.
c. There is an optimum temperature for each heating time, and the optimum temperature shifts to the lower side as the heating time is prolonged.
d. Generally, the heating time may be shortened as the temperature is elevated, but should be longer than 0.25 hr.
e. The temperature dependence of the luminous efficiency becomes stronger as the heating time is prolonged, and a heating time longer than about 6 hours seems practically of little merit from the viewpoint of either production cost or improvement in the luminous efficiency.

Figure 4:
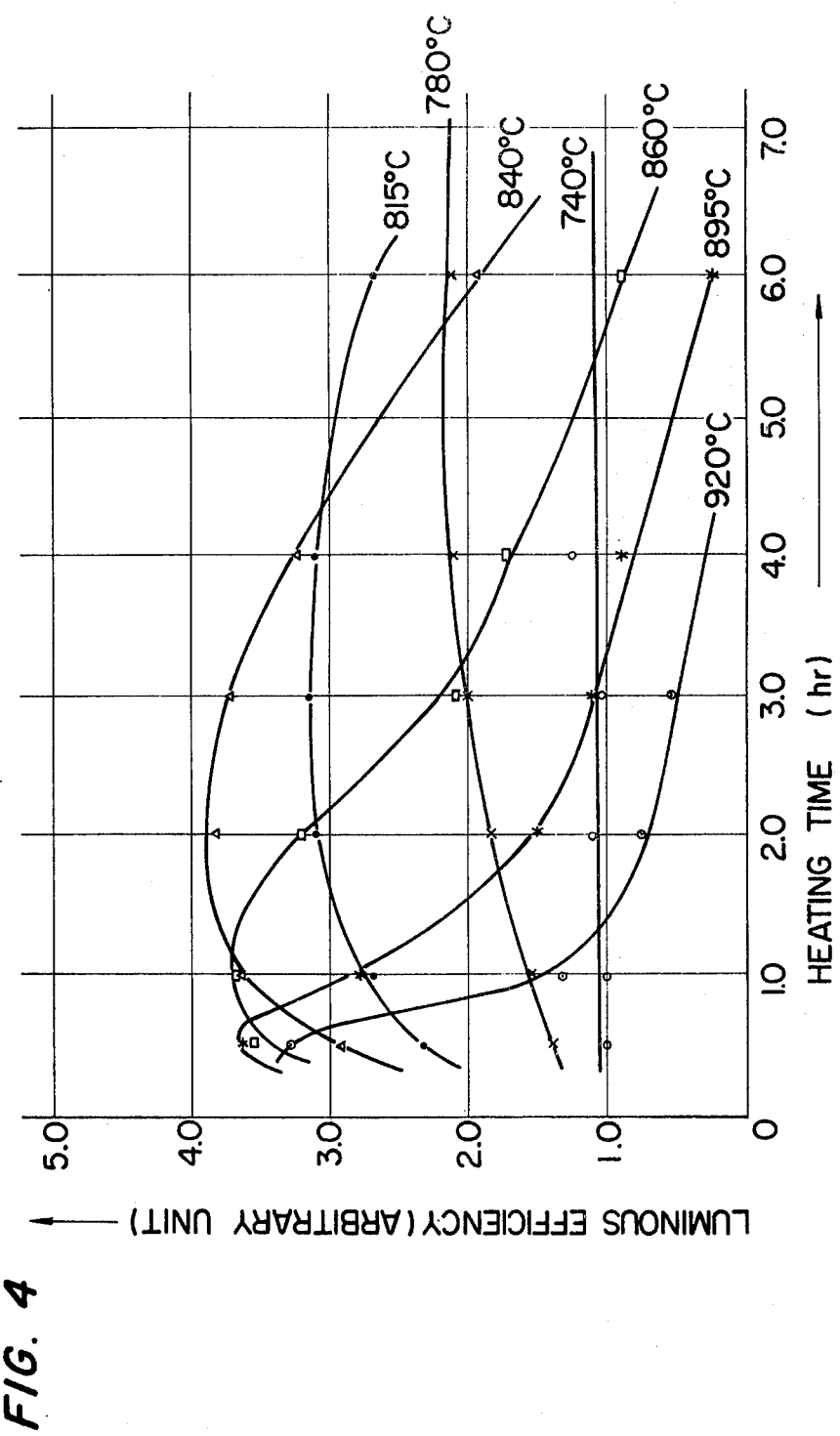
FIG. 4 is a graph showing the relationship between the heating time in a method of the invention and the luminous efficiency of the similar diodes.

The graph of FIG. 4 shows the relationship between the heating time and the luminous efficiency for several heating temperatures and teaches the following matters.

f. The luminous efficiency increases gradually as the heating time is prolonged if the temperature lies in the range between about 740° and about 800°C.
g. There is an optimum heating time for each heating temperature above about 800°C, and the optimum heating time is prolonged as the temperature is decreased.
h. Highest luminous efficiency values can be obtained when the heating time is about 0.5 to 3 hours.

Figure 5:
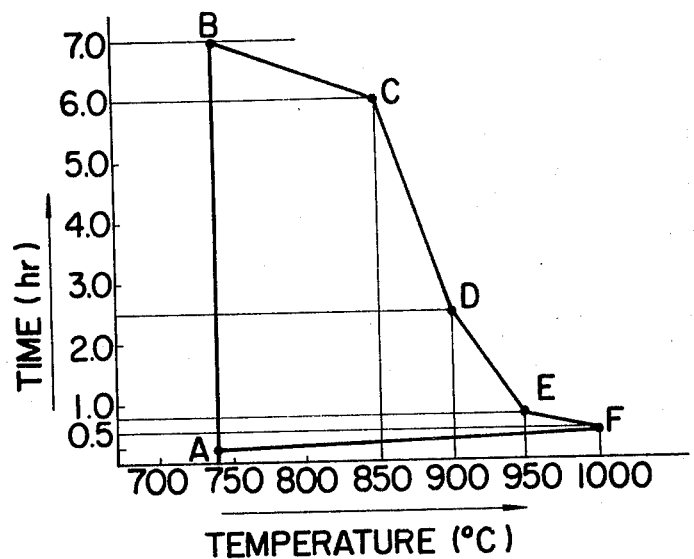
FIG. 5 is a diagram showing the effective range of the heating conditions for a method of the invention.

In view of these informations from the experimental results, it is concluded that the heating temperature and heating time in a method of the invention should lie within the polygonal area A-B-C-D-E-F shown in FIG. 5. The polygonal area is bounded by the lines connecting the points or coordinates A(740°C, 0.25 hr), B(740°C, 7 hr), C(850°C, 6 hr), D(900°C, 2.5 hr), E(950°C, 0.75 hr) and F(1000°C, 0.5 hr). Within this area, a temperature above about 850°C allows the heat treatment to complete in a relatively short period, and a temperature below about 850°C gives a substantially constant value of luminous efficiency over a relatively wide range of heating time. To produce a green-light-emitting diode 10 which exhibits a maximum magnitude of luminous efficiency, the heating conditions are preferably determined in the temperature range between 820° and 880°C of the polygonal A-B-C-D-E-F.

The preferred embodiments of the invention will be illustrated by the following examples.

EXAMPLE 1

The apparatus of FIG. 2 was used. The reaction tube 30 was of quartz, and the source material 20 for the crystal growth was a gallium melt saturated with GaP and admixed with sulfur as an n-type dopant. The reaction tube 30 was heated in a furnace so as to keep the gallium melt 20 and the GaP crystal substrate 11 at 930° and at 830°C, respectively. A stream of $H_2$ gas carrying $PCl_3$ gas was passed into the tube 30 from the gas inlet 40 to epitaxially grow the n-type GaP crystal layer 12 on the substrate 11. When the epitaxial layer 12 had grown about 100 microns thick, the other gas inlet 50 was opened to feed $NH_3$ gas carried by $H_2$ into the tube 30. The feed of the $PCl_3$-$H_2$ and $NH_3$-$H_2$ gases was continued until the nitrogen-doped n-type GaP epitaxial layer 13 had grown about 40 microns thick. The concentration of the doped nitrogen atoms was about $1 \times 10^{20}/cm^3$. Then the feed of $PCl_3$ and $NH_3$ to the gas inlets 40 and 50 was ceased, so that only $H_2$ was passed through the tube 30 thereafter, and the furnace temperature was regulated to maintain the substrate 11 at 840°C. The heating at this temperature and the passing of $H_2$ were continued for 2 hr. The substrate 11 was taken out of the tube 30 when the temperature had fallen nearly to room temperature, and the p-type layer 14 was formed by diffusion of zinc in a usual manner on the surface region of the nitrogen-doped layer 13. The thus produced green-light-emitting GaP diode 10 exhibited a luminous efficiency about 4 times as high as that of a similar diode produced by the same procedures except for exclusion of the heating at 840°C in $H_2$.

EXAMPLE 2

Figure 6:
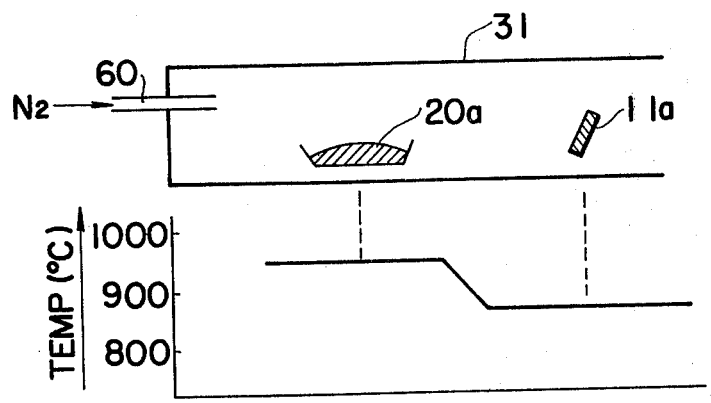
FIG. 6 is a diagrammatic sectional view of apparatus for carrying out a method of the invention.

Example 1 was repeated until the completion of the growth of the nitrogen-doped epitaxial layer 13. Then the feed of $PCl_3$ and $NH_3$ to the gas inlets 40 and 50 was ceased so as to continue only the feed of $H_2$ into the tube 30, and the heating of the furnace was ceased. When the reaction tube 30 was naturally cooled to room temperature, the substrate 11 having the epitaxial layers 12 and 13 was taken out of the tube 30 and placed in a separate quartz open tube 31 as indicated by the reference numeral 11a in FIG. 6. A gallium melt 20a saturated with GaP was placed in the tube 31 at a location relatively nearer to a gas inlet 60 provided through one end of the tube 31. A stream of $N_2$ was passed into the tube 31 from the gas inlet 60 and the tube 31 was heated so as to produce a temperature gradient as illustrated in FIG. 6 and to maintain the gallium melt at 20a at 950°C and the crystal 11a at 860°C. The heating was continued for 1 hr. After that the crystal 11a was taken out of the tube 31 and subjected to zinc doping likewise in the case of Example 1. The resulting green-light-emitting diode 10 exhibited a luminious efficiency nearly the same as that attained in Example 1.

EXAMPLE 3

The GaP crystal 11a having the epitaxial layers 12 and 13 was prepared by the steps of Example 1 and taken out of the reaction tube 30. Then, the surface of the nitrogen-doped layer 13 was coated with a film of $SiO_2$. The film thickness was about 1000 A. The coated crystal was heated in a $H_2$ atmosphere at a temperature of 840°C for a period of 2 hr. After that the $SiO_2$ film was removed and the crystal 11a was subjected to zinc doping in the same manner as in Example 1. The luminous efficiency of the resulting green-light-emitting diode 10 was substantially similar to the values observed in Examples 1 and 2.

Similar results were obtained when $Si_3N_4$ or $Al_2O_3$ was used as the coating material and/or when the heating was carried out in Ar or a mixture of $H_2$ and $N_2$ or under vacuum of at least $10^{-5}$ mmHg. The thickness of the protection film is preferably at least about 500 A, and may be varied depending on the film material. For example, a film of $Si_3N_4$ tends to suffer from cracks if the film is as thick as 1000 A. Since the evaporation of gallium and phosphorus from the epitaxial layer 13 is protected by the coating of a stable material, a vapor source such as the gallium melt 20 saturated with GaP is not necessary in this embodiment of the invention.

The above description is particularly related to the production of the green-light-emitting GaP diode 10, but it will be understood that a method of the invention is applicable to epitaxial GaP layers for various other purposes, e.g., for a semiconductor laser. The heating temperature and the heating time should lie always in the polygonal area of FIG. 5, but optimum conditions may differ depending on the purpose.

What is claimed is:

1. A method of healing defects and strains in an n-type epitaxial layer of gallium phosphide, which layer is deposited by vapor phase growth on an n-type gallium phosphide substrate and has a surface region doped with nitrogen, comprising prior to formation of a p–n junction heating the epitaxial layer at a temperature and for a period of time lying within the polygonal area A-B-C-D-E-F shown in FIG. 5 of the drawing which is bounded by the lines connecting the coordinates

|   | temperature, °C | time, hr |
|---|---|---|
| A | 740 | 0.25 |
| B | 740 | 7.0 |
| C | 850 | 6.0 |
| D | 900 | 2.5 |
| E | 950 | 0.75 |
| F | 1000 | 0.5 | and said heating taking place with said epitaxial layer in a stream of a gas inactive with said epitaxial layer and in the presence of a gallium melt saturated with gallium phosphide so that evaporation of any component of said epitaxial layer is prevented and chemical action with any foreign substance thereon is prevented during said heating.

2. A method according to claim 1, wherein said gas is selected from the group consisting of hydrogen, nitrogen and argon.

3. A method according to claim 1, wherein said gallium melt is maintained at a temperature of 930° to 950°C.

4. A method according to claim 1, wherein said temperature is in the range between 800°C and 900°C.

5. A method of healing defects and strains in an n-type epitaxial layer of gallium phosphide, which layer is deposited by vapor phase growth on an n-type gallium phosphide substrate and has a surface region doped with nitrogen, comprising prior to formation of a p–n junction heating the epitaxial layer at a temperature and for a period of time lying within the polygonal area A-B-C-D-E-F shown in FIG. 5 of the drawing which is bounded by the lines connecting the coordinates

|   | temperature, °C | time, hr |
|---|---|---|
| A | 740 | 0.25 |
| B | 740 | 7.0 |
| C | 850 | 6.0 |
| D | 900 | 2.5 |
| E | 950 | 0.75 |
| F | 1000 | 0.5 | and before heating the epitaxial layer coating said epitaxial layer with a film of a protective material selected from the group consisting of silicon dioxide, silicon nitride and aluminum oxide.

6. A method according to claim 5, wherein said film of said protective material is at least 500 A thick.

7. A method according to claim 5, wherein the coated epitaxial layer is heated in an atmosphere of a gas selected from the group consisting of argon, hydrogen and a mixture of hydrogen and nitrogen.

8. A method according to claim 5, wherein the coated epitaxial layer is heated under vacuum of at least $10^{-5}$ mmHg.

* * * * *